US010862151B2

(12) United States Patent
Kim et al.

(10) Patent No.: US 10,862,151 B2
(45) Date of Patent: Dec. 8, 2020

(54) POLYPHENYLSULFONE-BASED PROTON CONDUCTING POLYMER ELECTROLYTE, PROTON CONDUCTING SOLID POLYMER ELECTROLYTE MEMBRANE, ELECTRODE CATALYST LAYER FOR SOLID POLYMER FUEL CELLS, METHOD FOR PRODUCING ELECTRODE CATALYST LAYER FOR SLID POLYMER FUEL CELLS, AND FUEL CELL

(71) Applicant: NATIONAL INSTITUTE FOR MATERIALS SCIENCE, Tsukuba (JP)

(72) Inventors: Jedeok Kim, Tsukuba (JP); Yaojian Zhang, Tsukuba (JP)

(73) Assignee: NATIONAL INSTITUTE FOR MATERIALS SCIENCE, Tsukuba (JP)

( * ) Notice: Subject to any disclaimer, the term of this patent is extended or adjusted under 35 U.S.C. 154(b) by 143 days.

(21) Appl. No.: 15/744,640

(22) PCT Filed: Jul. 29, 2016

(86) PCT No.: PCT/JP2016/072350
§ 371 (c)(1),
(2) Date: Jan. 12, 2018

(87) PCT Pub. No.: WO2017/029967
PCT Pub. Date: Feb. 23, 2017

(65) Prior Publication Data
US 2018/0198149 A1 Jul. 12, 2018

(30) Foreign Application Priority Data

Aug. 17, 2015 (JP) ................................. 2015-160418

(51) Int. Cl.
*H01M 8/1027* (2016.01)
*H01M 8/1032* (2016.01)
(Continued)

(52) U.S. Cl.
CPC .......... *H01M 8/1027* (2013.01); *C08G 65/38* (2013.01); *C08G 75/23* (2013.01); *C08L 81/06* (2013.01);
(Continued)

(58) Field of Classification Search
None
See application file for complete search history.

(56) References Cited

U.S. PATENT DOCUMENTS 4,273,903 A 6/1981 Rose
4,413,106 A 11/1983 Coplan et al.
(Continued)

FOREIGN PATENT DOCUMENTS

EP 1772922 A1 4/2007
JP 2003-031232 A 1/2003
(Continued)

OTHER PUBLICATIONS

Office Action in Japan application No. 2017-535314, including English translation, dated Oct. 24, 2018, pp. 1-7.
(Continued)

*Primary Examiner* — Wojciech Haske
(74) *Attorney, Agent, or Firm* — Brinks Gilson & Lione (57) ABSTRACT

The present invention addresses the problem of providing a crosslinked film and a hydrocarbon-based proton conducting solid electrolyte having a proton conductivity equal to that of a perfluorosulfonate ion exchange polymer. Disclosed as a means for solving this problem is a proton conducting polymer electrolyte which is composed of a sulfonated polyphenyl compound having a plurality of repeating units, and wherein two or more (for example, four or six) sulfonic groups are introduced into one repeating unit on average. The sulfonated polyphenyl compound may be a polymer or copolymer having a skeleton structure selected from among
(Continued)

a polyaryl sulfide, a polyaryl ether, a polyarylsulfone, a polyarylketone and a polyaryl hexafluoroisopropylidene. A proton conducting solid polymer electrolyte membrane is able to be produced by shaping this proton conducting polymer electrolyte into a film form and crosslinking this proton conducting polymer electrolyte via sulfonic groups.

9 Claims, 5 Drawing Sheets

(51) Int. Cl.

| | | |
|---|---|---|
| C08G 75/23 | (2006.01) | |
| C08G 65/38 | (2006.01) | |
| C08L 81/06 | (2006.01) | |
| H01M 4/88 | (2006.01) | |
| H01M 8/1039 | (2016.01) | |
| H01M 8/1018 | (2016.01) | |
| H01M 4/86 | (2006.01) | |
| H01M 8/1023 | (2016.01) | |
| C08L 45/00 | (2006.01) | |
| C08L 71/12 | (2006.01) | |
| C08L 81/08 | (2006.01) | |
| G01R 33/46 | (2006.01) | |
| H01M 8/1025 | (2016.01) | |
| H01M 8/103 | (2016.01) | |

(52) U.S. Cl.
CPC ........... *H01M 8/1032* (2013.01); *C08L 45/00* (2013.01); *C08L 71/12* (2013.01); *C08L 81/08* (2013.01); *C08L 2203/20* (2013.01); *G01R 33/46* (2013.01); *H01M 4/8663* (2013.01); *H01M 4/88* (2013.01); *H01M 8/103* (2013.01); *H01M 8/1023* (2013.01); *H01M 8/1025* (2013.01); *H01M 8/1039* (2013.01); *H01M 2008/1095* (2013.01); *H01M 2300/0082* (2013.01); *Y02P 70/50* (2015.11)

(56) References Cited

U.S. PATENT DOCUMENTS

| | | | |
|---|---|---|---|
| 5,013,765 A | 5/1991 | Sluma et al. | |
| 5,438,082 A | 8/1995 | Helmer-Metzmann et al. | |
| 2002/0091225 A1 | 7/2002 | McGrath et al. | |
| 2006/0003210 A1* | 1/2006 | Ofer | C08J 5/2218 |
| | | | 429/493 |
| 2007/0072982 A1 | 3/2007 | Choi et al. | |
| 2011/0136040 A1 | 6/2011 | Hwang et al. | |

FOREIGN PATENT DOCUMENTS

| | | |
|---|---|---|
| JP | 2003-147074 A | 5/2003 |
| JP | 2004-509224 A | 3/2004 |
| JP | 2004-158260 A | 6/2004 |
| JP | 2007-084786 A | 4/2007 |
| JP | 2007-103378 A | 4/2007 |
| JP | 2008-037896 A | 2/2008 |
| JP | 2015-170583 A | 9/2015 |
| WO | WO 00/24796 A1 | 5/2000 |
| WO | WO 2010/116867 A1 | 10/2010 |

OTHER PUBLICATIONS

International Preliminary Report on Patentability, and English language translation thereof, in corresponding International Application No. PCT/JP2016/072350, dated Mar. 1, 2018, 13 pages.

Bae, B. et al., "Effect of the Hydrophobic Component on the Properties of Sulfonated Poly(arylene ether sulfone)s", *Macromolecules*, vol. 42, 2009, pp. 1873-1880.

Di Vona, M. L. et al., "High Performance Sulfonated Aromatic Ionomers by Solvothermal Macromolecular Synthesis", *International Journal of Hydrogen Energy*, vol. 37, 2012, pp. 8672-8680.

Hickner, M. A., et al., "Alternative Polymer Systems for Proton Exchange Membranes (PEMs)", Chem. Rev.,No. 104, 2004, pp. 4587-4612.

Kim, J. et al., "Crosslinked SPES-SPPSU Membranes for High Temperature PEMFCs", *International Journal of Hydrogen Energy*, vol. 38, 2013, pp. 1517-1523.

Mikhailenko, S. et al., "Proton Conducting Membranes Based on Cross-Linked Sulfonated Poly(ether ether ketone) (SPEEK)", *Journal of Membrane Science*, vol. 233, 2004, pp. 93-99.

English language translation of International Search Report in corresponding International Application No. PCT/JP2016/072350, dated Oct. 25, 2016, 2 pages.

Second Office Action in Japan Application No. 2017-535314, including English Translation, dated Apr. 19, 2019, 6 pages.

M.L. Di Vona et al., Journal of Membrane Science, vol. 354, No. 1-2, Mar. 1, 2010, pp. 134-141, XP055518590.

Feng Wang et al., Journal of Membrane Science, vol. 197, No. 1-2, Mar. 15, 2002, pp. 231-242, XP004334322.

Giorgi Titvinidze et al., Advanced Functional Materials, vol. 22, No. 21, Nov. 7, 2012, pp. 4456-4470, XP001581905.

Byungchan Bae et al., Macromolecules, vol. 42, No. 6, Mar. 24, 2009, pp. 1873-1880, XP055565838.

C. Genies et al., Polymer, vol. 42, No. 2, Jan. 1, 2001, pp. 359-373, XP004216918.

Serguei D. Mikhailenko et al., Journal of Membrane Science, vol. 233, No. 1-2, Apr. 15, 2004, pp. 93-99, XP004500781.

Extended European Search Report in Europe Application No. 16836958.5, 12 pages, dated Mar. 19, 2019.

Linkous, et al., "Rapid Communication", J. Polym. Sci., vol. 86: 1197-1199 (1998).

Wang, et al, "Direct polymerization of sulfonated poly(arylene ether sulfone) random (statistical) copolymers: candidates for new proton exchange membranes", J. Memb. Sci., vol. 197: 231-242 (2002).

* cited by examiner

POLYPHENYLSULFONE-BASED PROTON CONDUCTING POLYMER ELECTROLYTE, PROTON CONDUCTING SOLID POLYMER ELECTROLYTE MEMBRANE, ELECTRODE CATALYST LAYER FOR SOLID POLYMER FUEL CELLS, METHOD FOR PRODUCING ELECTRODE CATALYST LAYER FOR SLID POLYMER FUEL CELLS, AND FUEL CELL

This application is a 371 application of PCT/JP2016/072350 having an international filing date of Jul. 29, 2016, which claims priority to JP2015-160418 filed Aug. 17, 2015, the entire contents of each of which is incorporated herein by reference.

TECHNICAL FIELD

The present invention relates to a polyphenylsulfone-based proton conducting polymer electrolyte, a proton conducting solid polymer electrolyte membrane, an electrode catalyst layer for solid polymer fuel cells (also referred to as a PEMFC: proton exchange membrane fuel cell) having excellent proton conductivity, mechanical strength, a gas barrier property, and durability even under a low humidification condition and a high temperature condition, and a method for producing the same. The present invention also relates to a PEMFC fuel cell using such an electrolyte as an electrolyte membrane or an ionomer in a catalyst layer.

BACKGROUND ART

A PEMFC using hydrogen gas and oxygen gas is a clean energy system, has high energy density and high conversion efficiency, and thus has attracted attention as an electric power generation device of next generation. Over the past few decades, perfluorosulfonic acid ion exchange polymers such as Nafion (a registered trademark of E.I du Pont de Nemours and Company) (a perfluorocarbon material comprised of a hydrophobic perfluorocarbon backbone and perfluoro side chains having sulfonic acid groups, i.e. a copolymer of tetrafluoroethylene and perfluoro[2-(fluorosulfonylethoxy)propyl vinyl ether]) has been used as an electrolyte membrane. Nafion has high conductivity even with low humidity due to a proton conduction path caused by a cluster structure. However, Nafion has disadvantages such as high cost due to multi-step synthesis, large gas crossover, low mechanical strength, difficulty of using at high temperatures due to low glass transition temperature, problems of disposal after use, and difficulty of recycling of the material.

In order to overcome these problems, hydrocarbon-based electrolyte membranes that are inexpensive and have good film properties to replace Nafion have been developed (see Non-Patent Literatures 1 to 3). Among these, there is a report of obtaining high proton conductivity by a method of crosslinking with an electrolyte having an increased degree of sulfonation in a repeating unit of polyether ketone (PEK) or polysulfone (PS) polymer (see Non-Patent Literatures 2 and 4). In addition, the Applicant of this application has also studied fabrication of an electrolyte membrane using an alcohol-based solvent. However, in order to realize a PEMFC having high performance utilizing a hydrocarbon-based electrolyte membrane, higher proton conductivity is required.

In addition, since perfluorosulfonic acid has been used conventionally as an electrolyte substance for an ionomer to be contained in an electrode catalyst, the electrolyte substance has the same disadvantage as the electrolyte membrane provided between electrodes. Therefore, it is convenient if the ionomer used in the electrode catalyst can also be replaced by a hydrocarbon-based electrolyte.

CITATION LIST

Non-Patent Literature

NON-PATENT LITERATURE 1: M. A. Hickner, H. Ghassemi, Y-S. Kim, B. R. Einsla, J. E. McGrath, Chem. Rev., 2004, 104, 4587-4612.

NON-PATENT LITERATURE 2: J.-D. Kim, A. Donnadio, M.-S. Jun, M. L. Di Vona, Int. J. Hydro. Ene., 2013, 38(3), 1517-1523.

NON-PATENT LITERATURE 3: B. Bae, K. Miyatake, M. Watanabe, Macromolecules, 2009, 42(6), 1873-1880.

NON-PATENT LITERATURE 4: M. L. Di Vona, G. Alberti, E. Sgreccia, M. Casciola, P. Knauth, Int. J. Hydrogen Energy, 2012, 37, 8672-80.

NON-PATENT LITERATURE 5: S. D. Mikhailenko, K. Wang, S. Kaliaguine, P. Xing, G. P. Robertson, M. D. Guiver, J. of Membrane Science 2004, 233, 93-99.

SUMMARY OF INVENTION

Technical Problem

An object of the present invention is to solve the above-described disadvantages of the conventional techniques and provide a hydrocarbon-based proton conducting solid electrolyte having high proton conductivity comparable to a perfluorosulfonic acid ion exchange polymer and a membrane of the solid electrolyte.

Solution to Problem

According to an aspect of the present invention, a proton conducting polymer electrolyte comprised of a sulfonated polyphenyl compound having a plurality of repeating units, wherein two or more sulfonic groups (—$SO_3H$: also referred to as a sulfonic acid group or a sulfo group) are introduced on average into one repeating unit, is provided.

It is noted that the sulfonation herein encompasses not only the case of introducing a sulfonic group (—$SO_3H$) but also the case of introducing a group which is an alkali metal (e.g. Na) salt or an alkaline earth metal salt thereof.

In this connection, the sulfonated polyphenyl compound herein may be a polymer or copolymer comprising a backbone structure selected from the group consisting of polyaryl sulfide, polyaryl ether, polyaryl sulfone, polyaryl ketone, and polyaryl hexafluoroisopropylidene.

Further, the sulfonated polyphenyl compound may comprise, as a backbone structure, a polymer or copolymer formed from at least one selected from the following monomers or at least one selected from the following polymers or copolymers:

wherein a is an integer of 1 to 20;

wherein, independently for each repeating unit, x is an integer of 1 or more and y is an integer of 0 or more, and the sequential arrangement of the structures involving x or y is arbitrary;

wherein, independently for each repeating unit, x is an integer of 0 or more and y is an integer of 0 or more provided that the sum of x and y is 1 or more, and the sequential arrangement of the structures involving x or y is arbitrary.

The sulfonated polyphenyl compound may be selected from the following group:

According to another aspect of the present invention, a proton conducting solid polymer electrolyte membrane comprised of any one of the proton conducting polymer electrolytes described above in the form of a membrane crosslinked via sulfonic groups is provided.

According to still another aspect of the present invention, a method for producing a proton conducting solid polymer electrolyte membrane comprising forming any one of the proton conducting polymer electrolytes described above in the form of a membrane and crosslinking the proton conducting polymer electrolyte via sulfonic groups is provided.

Here, the crosslinking may be performed by a single treatment or a combination of a plurality of treatments selected from the group consisting of heat treatment, crosslinking treatment by means of addition of a crosslinking agent, and exposure treatment to radiation or electromagnetic wave.

In addition, the crosslinking agent may be a polyhydric alcohol.

According to still another aspect of the present invention, a solid polymer fuel cell comprising the above-described proton conducting solid polymer electrolyte membrane is provided.

According to still another aspect of the present invention, an electrode catalyst layer for solid polymer fuel cells, the electrode catalyst layer comprising any one of the proton conducting polymer electrolytes described above crosslinked via sulfonic groups, is provided.

According to still another aspect of the present invention, a method for producing an electrode catalyst layer for solid polymer fuel cells comprising mixing at least an electrode catalyst and any one of the proton conducting polymer electrolytes described above and then crosslinking the proton conducting polymer electrolyte via sulfonic groups.

Here, the crosslinking may be performed by a single treatment or a combination of a plurality of treatments selected from the group consisting of heat treatment, crosslinking treatment by means of addition of a crosslinking agent, and exposure treatment to radiation or electromagnetic wave.

According to still another aspect of the present invention, a solid polymer fuel cell comprising the above-described electrode catalyst layer is provided.

Advantageous Effects of Invention

According to the present invention, there is provided a hydrocarbon-based solid electrolyte having proton conductivity comparable to or higher than that of a perfluorosulfonic acid ion exchange polymer. In addition, since the electrolyte of the present invention is hydrocarbon-based, high mechanical strength and durability, low environmental load, and so forth can be realized as compared with a fluorine-based polymer. Thus, by using the hydrocarbon-based solid electrolyte of the present invention as a solid electrolyte of a solid electrolyte membrane for a PEMFC and/or as an ionomer of an electrode catalyst layer, a PEMFC of high performance, high durability, low cost, and low environmental load can be realized.

DESCRIPTION OF EMBODIMENTS

According to an aspect of the present invention, a hydrocarbon-based solid electrolyte having a high sulfonation degree that is sufficiently sulfonated to be soluble in water is synthesized as an electrolyte polymer of a PEMFC. By crosslinking the highly sulfonated electrolyte, a stabilized proton conducting solid electrolyte membrane can be obtained. As a result, a hydrocarbon-based electrolyte membrane having proton conductivity equal to or higher than that of a Nafion electrolyte membrane and exhibiting high proton conductivity even under high temperature/low humidity conditions is provided. In addition, since the solid electrolyte membrane obtained in this way is a hydrocarbon-based polymer, higher mechanical strength, higher chemical stability, higher output in a fuel cell, and more excellent physical durability than a perfluorosulfonic acid ion exchange polymer can be expected to be attained.

Specifically, an aspect of the present invention is provided as an electrolyte comprised of a sulfonated polyphenyl compound having two or more sulfonic groups introduced on average in one repeating unit.

The sulfonated polyphenyl compound is not particularly limited in terms of degree and position of sulfonation and degree of polymerization except that the sulfonated polyphenyl compound has two or more sulfonic groups on average in one repeating unit. In general, the average number of sulfonic groups in one repeating unit may be 2 to 16, and in consideration of the balance between the proton conductivity and mechanical strength, the average number is more preferably 2 to 8. Typically, the average number of sulfonic groups in one repeating unit may be 2, 4 or 6.

The average number of sulfonic groups in one repeating unit of the sulfonated polyphenyl compound can be determined as follows. That is, for a sulfonated polyphenyl compound of interest, the average number of sulfonic groups in one repeating unit can be calculated by performing titration using a NaOH solution having a predetermined concentration, obtaining an ion exchange capacity by using a formula: ion exchange capacity (IEC) (meq/g)=[A]×[B]/sample weight (g) on the basis of the amount of NaOH solution ([A] ml) for neutralization to pH 7 and the concentration of the NaOH solution ([B] g/ml), and comparing this with a theoretical value.

The introduction of the sulfonic groups may be carried out at a monomer stage or on the polymer after polymerization/copolymerization.

The method for introducing the sulfonic groups is not particularly limited, and any known method may be used. As far as sulfonated polyphenylsulfone (SPPSU) is concerned, for example, a method disclosed in Examples of JP-A-2015-170583 (National Institute for Materials Science) can be used. Specifically, synthesis of 2S-PPSU which is a sulfonated polyphenylsulfone having two sulfonic groups introduced in one repeating unit and 4S-PPSU which is a sulfonated polyphenylsulfone having four sulfonic groups introduced in one repeating unit will be described in detail in the examples below.

An electrolyte membrane exhibiting thermal and mechanical stability and high proton conductivity can be obtained by casting the obtained electrolyte into a film (non-stretched film) and crosslinking (thermally crosslinking) the film by, for example, a heat treatment method.

Here, as the polyphenyl compound, a polymer, copolymer, or the like comprising a backbone structure selected from the group consisting of polyaryl sulfide, polyaryl ether, polyaryl sulfone, polyaryl ketone, and polyaryl hexafluoroisopropylidene can be suitably used.

Chemical structural formulas of the repeating unit of the polymer which is a usable polyphenyl compound or a constituent monomer thereof are exemplified below without limitation.

To be noted, although n (the number of repeating units) in the formula is not particularly limited, for example, n is such a value that the weight average molecular weight $M_w$ of the polyphenyl compound (weight average molecular weight in terms of polystyrene measured by gel permeation chromatography) can be in the range of 5,000 to 500,000, preferably of 10,000 to 400,000, and more preferably of 50,000 to 350,000. In addition, in another embodiment, although n (the number of repeating units) in the formula is not particularly limited, for example, n is such a value that the number average molecular weight $M_n$ of the polyphenyl compound (number average molecular weight in terms of polystyrene measured by gel permeation chromatography) can be in the range of 4,000 to 400,000, preferably of 10,000 to 300,000, and more preferably of 50,000 to 250,000.

To be noted, although n (the number of repeating units) in the formula is not particularly limited, for example, n is such a value that the weight average molecular weight $M_w$ of the polyphenyl compound (weight average molecular weight in terms of polystyrene measured by gel permeation chromatography) can be in the range of 5,000 to 500,000, preferably of 10,000 to 400,000, and more preferably of 50,000 to 350,000. In addition, in another embodiment, although n (the number of repeating units) in the formula is not particularly limited, for example, n is such a value that the number average molecular weight $M_n$ of the polyphenyl wherein a is an integer of 1 to 20.

Other chemical structural formulas of the repeating unit of the polymer which is a usable polyphenyl compound are exemplified below without limitation.

compound (number average molecular weight in terms of polystyrene measured by gel permeation chromatography) can be in the range of 4,000 to 400,000, preferably of 10,000 to 300,000, and more preferably of 50,000 to 250,000.

wherein, independently for each repeating unit, x is an integer of 1 or more and y is an integer of 0 or more, and the sequential arrangement of the structures involving x or y is arbitrary;

wherein, independently for each repeating unit, x is an integer of 0 or more and y is an integer of 0 or more provided that the sum of x and y is 1 or more, and the sequential arrangement of the structures involving x or y is arbitrary.

It goes without saying that compounds having the above-described chemical structures as a backbone structure and various substituents introduced therein can also be used.

It is noted that the crosslinking of the above-described proton conducting polymer electrolyte is not limited to thermal crosslinking but may be carried out by radiation such as electron beams, by irradiation of electromagnetic waves like a microwave oven, or by adding a crosslinking agent. Further, crosslinking can also be carried out by using a plurality of techniques in combination, for example, by performing heat treatment following addition of a crosslinking agent.

In one non-limiting embodiment, the proton conducting polymer electrolyte is dissolved or dispersed, optionally with a crosslinking agent, in water or an organic solvent (for example, dimethylsulfoxide (DMSO), dimethylacetamide (DMAc), dimethylformamide (DMF), N-methyl-2-pyrrolidone (NMP), or the like) to form a solution or dispersion, a cast film (non-stretched film) is obtained by using the solution or dispersion, and then a crosslinked membrane is obtained by heating the cast film at an elevated temperature. Here, the heating temperature and time are not particularly limited, but suitable conditions can be selected from the ranges of, for example, about 90° C. to 210° C. and about 1 hour to 3 days. It is also preferable to heat at a plurality of temperatures elevated stepwise. For example, heating may be performed continuously in a first stage of 100 to 140° C., a second stage of 140° C. to 180° C., and a third stage of 160° C. to 200° C. for 6 to 36 hours for each step.

Crosslinking by radiation such as electron beams or by irradiation of electromagnetic waves like a microwave oven may be carried out by any known method as long as sufficient crosslinking is possible.

The crosslinking agent which can be used is not particularly limited as long as the crosslinking agent has reactivity with a sulfonic group. The crosslinking agent may typically be a polyhydric alcohol. In the case of using a crosslinking agent, the mass ratio of the crosslinking agent to the proton conducting polymer electrolyte is not particularly limited; however, for example, it may be usually 0.1% by mass or more and 50% by mass or less, and more preferably 0.5% by mass or more and 30% by mass or less.

For example, crosslinking of the proton conducting polymer electrolyte can be formed by using a polyhydric alcohol as a crosslinking agent and utilizing the following reaction described in Non-Patent Literature 5. To be noted, in Non-Patent Literature 5, it has been reported that crosslinking of SPEEK (sulfonated polyether ether ketone) was carried out under various conditions using a polyhydric alcohol as a crosslinking agent. The results are summarized in Table 1 of this document (see those results if necessary).

n = 0 ethyleneglycol
n = 1 glycerine
n = 2 erythritol

The solid polymer electrolyte membrane formed by the above-described crosslinking can be used as an electrolyte membrane for a PEMFC.

In addition, the above-described solid polymer electrolyte can also be used as an ionomer to be contained in an electrode catalyst layer for a PEMFC. Such an electrode catalyst layer can be produced by, for example, thoroughly mixing a material required for the electrode catalyst layer such as an electrode catalyst with the above-mentioned solid polymer electrolyte before crosslinking into a required shape and then crosslinking the electrolyte. As a method for causing the crosslinking reaction, various methods described above regarding the production of a solid polymer electrolyte membrane, such as maintaining a temperature of 180° C. for a predetermined time in crosslinking by heating, can be used similarly.

The configuration of the electrode catalyst layer is not particularly limited as long as the above-described solid polymer electrolyte is used as an ion conductivity imparting agent (ionomer). A composition for forming an electrode catalyst layer is generally composed of a mixture of metal particles which are electrode catalysts, a conducting agent such as carbon black, and an ion conductivity imparting agent. Platinum or a platinum alloy can be generally used as the electrode catalyst, and other examples of the electrode catalyst include gold, silver, palladium, iridium, rhodium, ruthenium, tin, iron, cobalt, nickel, molybdenum, tungsten, vanadium, and alloys thereof. The content (basis weight) of the electrode catalyst in the electrode catalyst layer is not particularly limited, but may be usually about 0.01 to 10 mg/cm$^2$. The composition for forming the electrode catalyst layer is not particularly limited, but may contain usually 5 to 99% by mass, more generally 10 to 99% by mass, or typically 40 to 99% by mass of a solid polymer electrolyte as an ion conductivity imparting agent (ionomer).

The solid polymer fuel cell (proton exchange membrane fuel cell) of the present invention include an anode (air electrode), a cathode (fuel electrode), and a proton exchange membrane (solid polymer membrane) disposed between and in contact with two electrodes constituting the anode and the cathode; the proton exchange membrane includes the above-described proton conducting solid polymer electrolyte membrane, and/or the cathode includes the above-described electrode catalyst layer. That is, this proton exchange membrane fuel cell is not particularly limited as long as the proton exchange membrane includes the above-described proton conducting solid polymer electrolyte membrane and/ or the cathode includes the above-described electrode catalyst layer, and any known configuration can be employed.

It is noted that all numerical values and numerical ranges described in the specification and claims of the present application may include error ranges tolerated in the art, and it is intended that all of these may be modified with "about".

Examples

Hereinafter, the present invention will be described in more detail by giving examples, but obviously, the present invention is not limited to these examples.

[Synthesis of 2S-PPSU, 4S-PPSU and D6S-PPSU]

Compounds 2S-PPSU (2-sulfonated polyphenylsulfone) and 4S-PPSU (4-sulfonated polyphenylsulfone) in which 2 and 4 sulfonic groups were introduced into the repeating unit were synthesized by the reactions expressed by the following formulae.

Among the above-described series of reactions, the synthesis of SFPS (sulfonated diphenylsulfone) from FPS (bis (4-fluorophenyl) sulfone) which is a starting material:

was carried out as follows.

Figure 1:
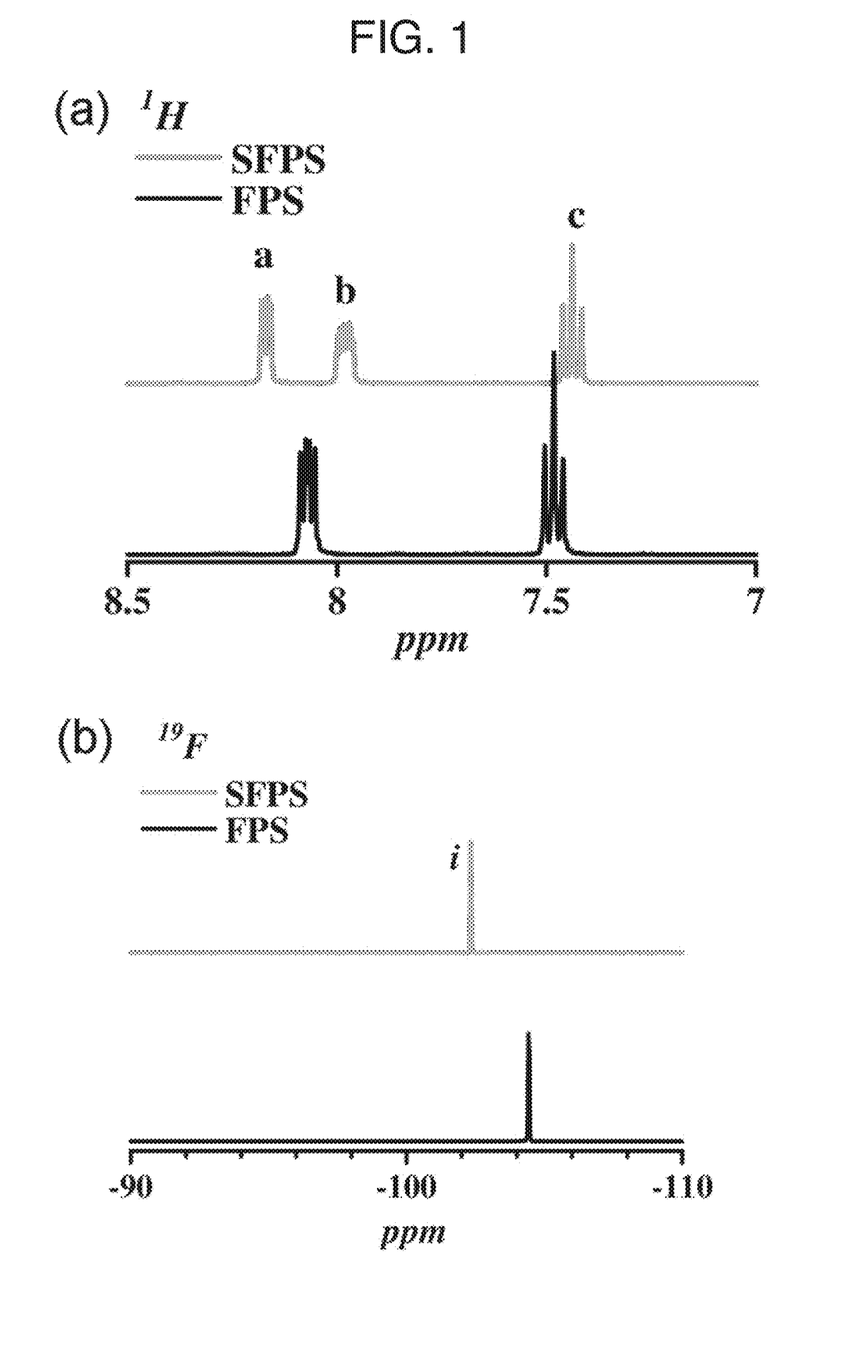
FIG. 1 is a diagram showing (a) $^1$H NMR and (b) $^{19}$F NMR of synthesized SFPS in comparison with FPS.

FPS (bis(4-fluorophenyl)sulfone) (5 g) and 30 wt % fuming sulfuric acid (10 mL) were charged into a 100 mL round bottom flask, and this mixture was heated at 120° C. for 12 hours. The mixture was then poured into ice brine to precipitate the product. The precipitate was filtered off, redissolved in water, and neutralized with an aqueous NaOH solution. Further, NaCl was added thereto so as to obtain a precipitate of a crude product. The crude product was recrystallized three times with a mixture liquid of water and ethanol to obtain SFPS of high purity. The yield was 3 g. $^1$H NMR and $^{19}$F NMR of the synthesized SFPS are shown in FIG. 1 in comparison with FPS.

Among the above-described series of reactions, the synthesis reaction of 2S-PPSU from SFPS:

was carried out as follows.

Figure 2:
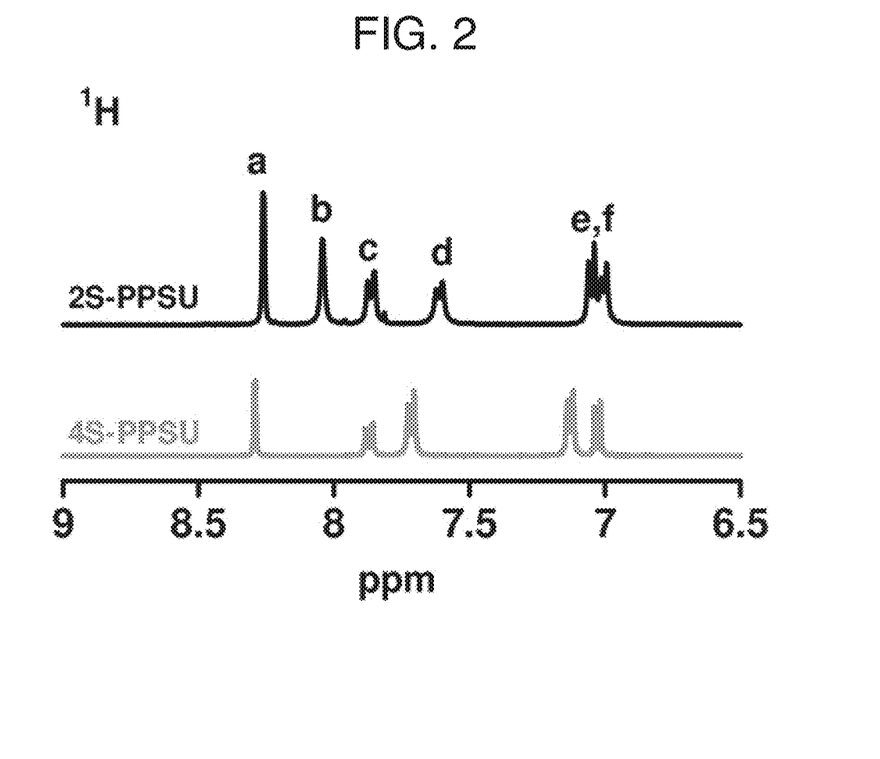
FIG. 2 is a diagram showing $^1$H NMR of synthesized 4S-PPSU in comparison with 2S-PPSU.

The SFPS (1.521 mmol) of high purity obtained above, BP (4,4'-biphenol) (1.521 mmol), $K_2CO_3$ (3.8025 mmol), DMSO, and toluene were charged into a 100 mL round bottom flask. Using a Dean-Stark trap, this mixture was heated and thus polymerized at 140° C. for 24 hours under a $N_2$ atmosphere. Thereafter, the mixture was poured into a 1M $H_2SO_4$ solution to precipitate resinous matter. This was filtrated, and then the resinous matter was redissolved in water, dialyzed, dehydrated, and dried to obtain a thin film. This thin film was washed twice with a 1M $H_2SO_4$ solution. This was then redissolved in water, dialyzed, dehydrated, and dried overnight at 80° C. in a vacuum oven. $^1$H NMR for the synthesized 2S-PPSU is shown in FIG. 2. It was found that the weight average molecular weight $M_w$ of the obtained 2S-PPSU measured by gel permeation chromatography in terms of polystyrene was 200,000, and the number average molecular weight $M_n$ thereof measured by the same method in terms of polystyrene was 138,000.

Also, among the above-described series of reactions, the last synthesis reaction from 2S-PPSU to 4S-PPSU:

was carried out as follows.

Figure 3:
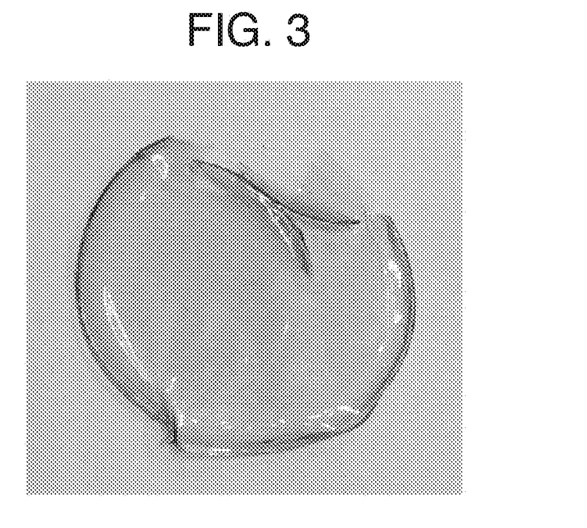
FIG. 3 is a photograph showing the appearance of a synthesized 4S-PPSU membrane (before thermal crosslinking).

2S-PPSU (0.25 g) and concentrated sulfuric acid (25 mL) were charged into a 100 mL round bottom flask and the mixture was heated at 60° C. for 2 days. Subsequently, this mixture was poured into ice water, dialyzed, dehydrated, and dried in a vacuum oven at 80° C. for 2 days to obtain 4S-PPSU. $^1$H NMR for the synthesized 4S-PPSU is shown in FIG. 2 in comparison with 2S-PPSU. By determining the $^1$H NMR spectrum shown in FIG. 2, it is believed that the above-described reaction was completed in 48 hours. After purifying the obtained 4S-PPSU, this polymer was dissolved in DMSO, spread on a flat glass plate, and dried overnight at 80° C. As a result of this, a transparent film (light yellow) shown in FIG. 3 was obtained. It was found that the weight average molecular weight $M_n$ of the obtained 4S-PPSU measured by gel permeation chromatography in terms of polystyrene was 279,000, and the number average molecular weight $M_n$ thereof measured by the same method in terms of polystyrene was 145,000.

Further, the synthesis reaction of a compound D6S-PPSU in which six sulfonic groups were introduced in one repeating unit:

was carried out as follows.

Figure 4:
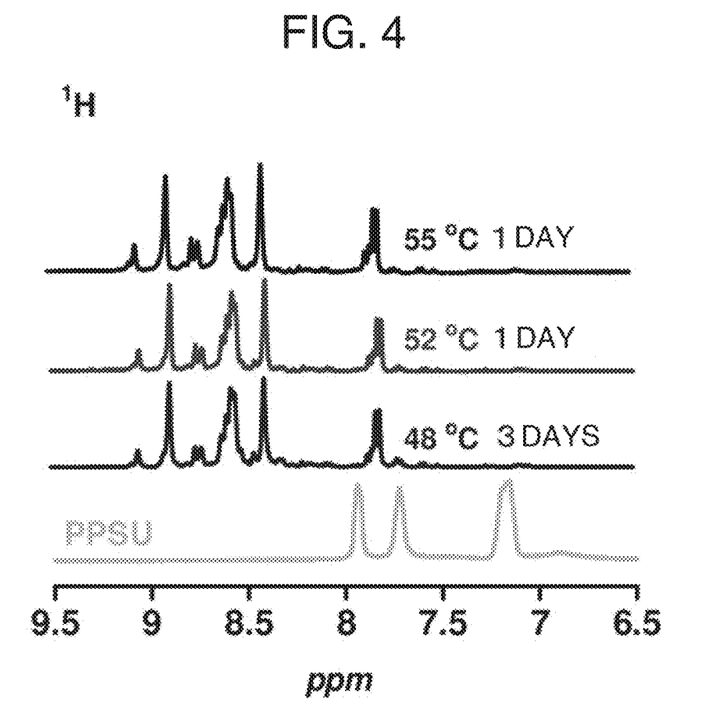
FIG. 4 is a diagram showing the change of $^1$H NMR with respect to reaction time in synthesis of D6S-PPSU.

PPSU (3 g) and 30 wt % fuming sulfuric acid (33 mL) were charged into a 100 mL round bottom flask, and this mixture was heated at 48° C. for 3 days, at 52° C. for 1 day, and further at 55° C. for 1 day. By determining the $^1$H NMR spectrum shown in FIG. 4, it is believed that the above-described sulfonation reaction was completed in 3 days, but in order to be sure, this heat treatment was further continued. Four large peaks were observed in this spectrum. The area ratio between these was 0.94:2.34:1.08:1.00, which was close to the area ratio 1:2:1:1 theoretically estimated from D6S-PPSU to be generated.

Figure 5:
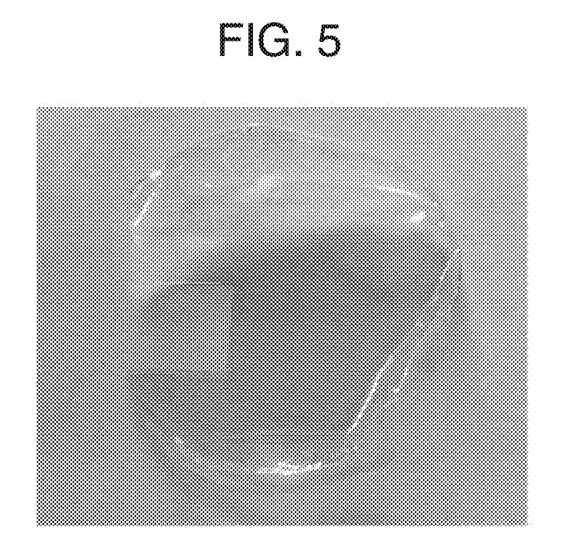
FIG. 5 is a photograph showing the appearance of a synthesized D6S-PPSU membrane (before thermal crosslinking).

Next, this mixture was poured into ice water to precipitate resinous matter. This was filtrated, and then the resinous matter was redissolved in water, dialyzed, dehydrated, and dried overnight at 80° C. in a vacuum oven. The polymer obtained after this purification treatment was dissolved in water, spread on a flat glass plate, and dried overnight at 45° C. Thus, the transparent film shown in FIG. 5 was obtained.

[Thermal Crosslinking of Membrane Using 2S-PPSU and 4S-PPSU and Proton Conductivity Measurement]

Figure 6:
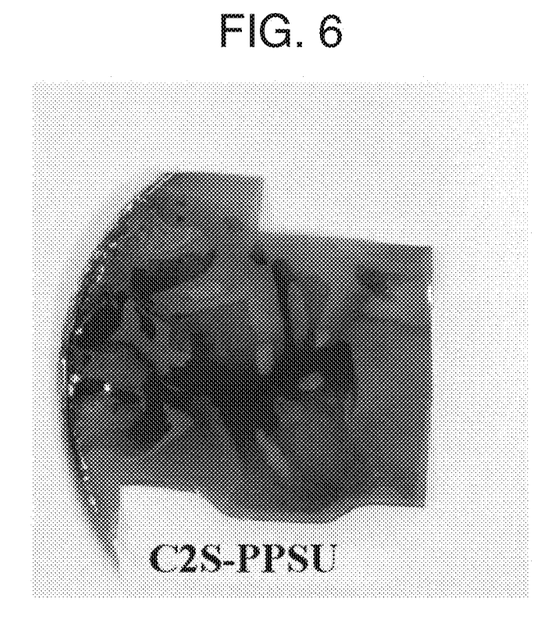
FIG. 6 is a photograph showing the appearance of a 2S-PPSU (C2S-PPSU) membrane after thermal crosslinking.

At the final stage of the synthesis of these compounds, membranes of the compounds were made by drying them in the form of films as described above. These membranes were treated at 120° C. for 24 hours, at 160° C. for 24 hours, and further at 180° C. for 6 hours to obtain thermally crosslinked membranes. The membranes before this heat treatment were soluble in water, but the thermally crosslinked membranes was not dissolved in water even at 180° C. The appearance of the thermally crosslinked 2S-PPSU membrane is shown in FIG. 6. Advantageously, the treatment time at 180° C. may be 6 hours or longer, for example, 24 hours. The reaction process starting from SFPS to obtain C2S-PPSU (i.e. thermally crosslinked 2S-PPSU) via 2S-PPSU can be expressed as follows.

Figure 7:
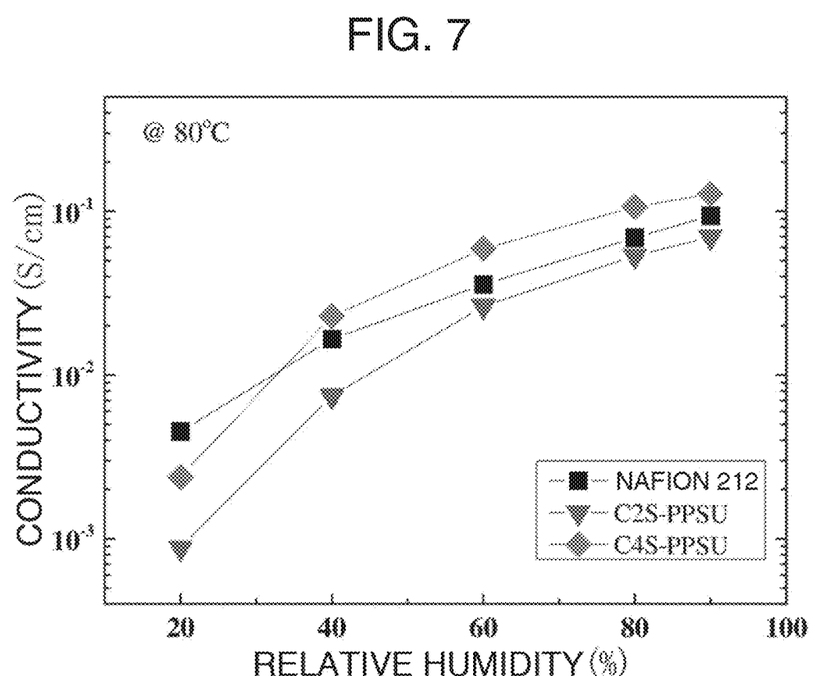
FIG. 7 is a graph showing results of measurement of the proton conductivity of electrolyte membranes of Examples and Nafion 212 membrane according to the change in relative humidity.

For the thermally crosslinked membranes C2S-PPSU and C4S-PPSU prepared from 2S-PPSU and 4S-PPSU in this way, the proton conductivities at 80° C. were determined while changing the relative humidity. The determination results are shown in FIG. 7. Further, the proton conductivity of the Nafion 212 membrane was also determined under the same conditions for comparison, and the results thereof are also shown in the figure. The membrane of C4S-PPSU, which is thermally crosslinked 4S-PPSU, showed higher proton conductivities than the other membranes, and specifically a high conductivity of about 0.2 S/cm was obtained at 90% relative humidity. In addition, the proton conductivity at a relative humidity of 40% or higher was larger than the proton conductivity of Nafion 212.

In addition, the proton conductivity herein was determined at cell temperatures of 40, 60, 80, 100, and 120° C. and at relative humidities (RH) of 20% to 90% using a membrane resistance measuring system MTS 740 (manufactured by TOYO Corporation). In the impedance determination, a frequency range of 1 Hz to 1 MHz and a peak-peak voltage of 10 mV were used.

Figure 8:
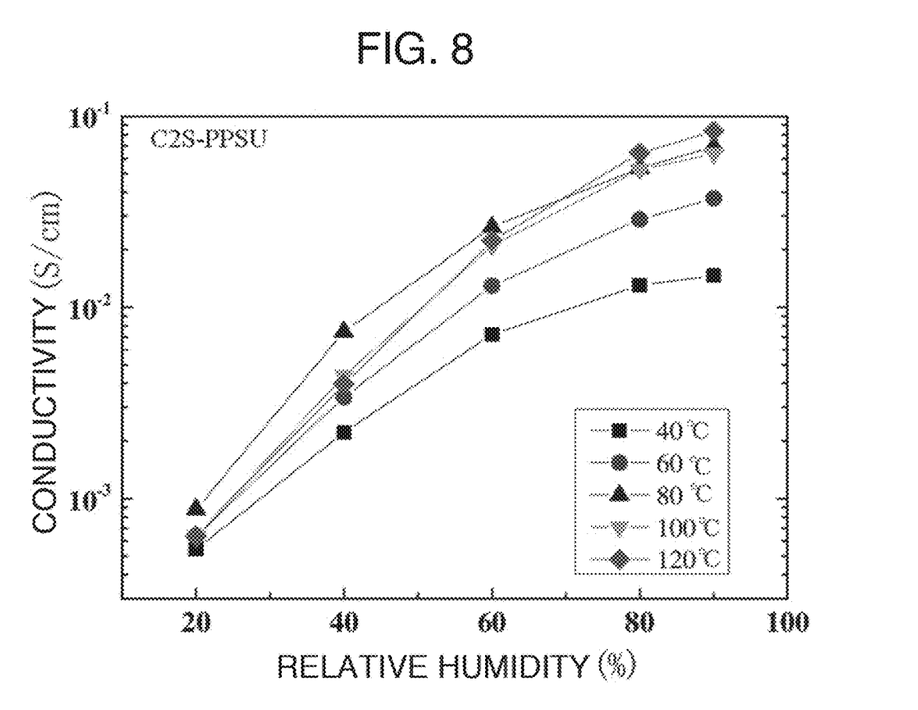
FIG. 8 is a graph showing results of measurement of the proton conductivity of a 2S-PPSU (C2S-PPSU) membrane of Examples after thermal crosslinking according to the change in temperature and relative humidity.
Figure 9:
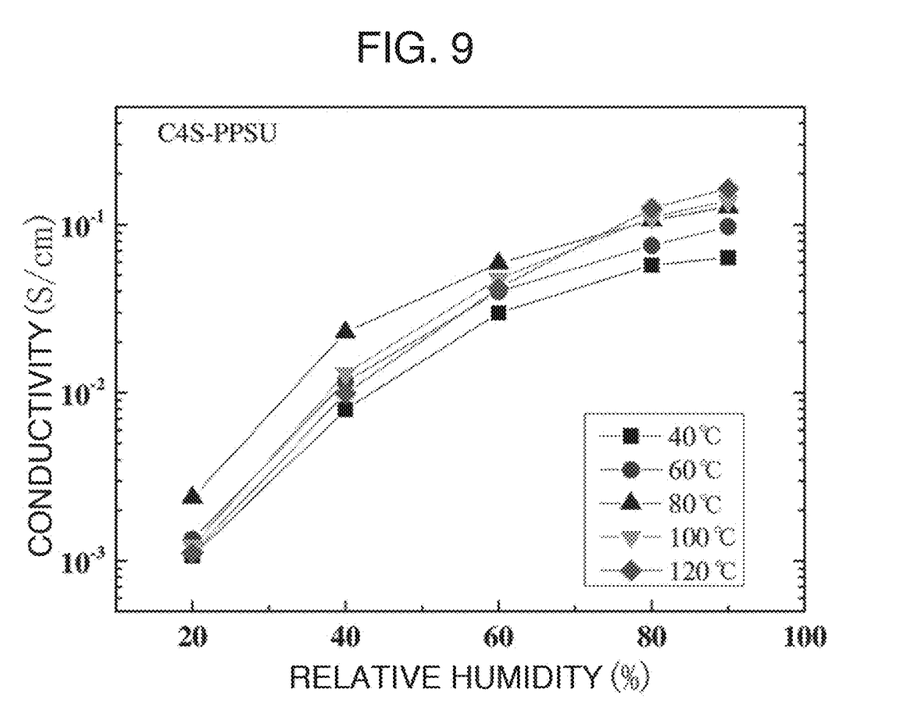
FIG. 9 is a graph showing results of measurement of the proton conductivity of a 4S-PPSU (C4S-PPSU) membrane of Examples after thermal crosslinking according to the change in temperature and relative humidity.

Further, regarding C2S-PPSU, the proton conductivities thereof were determined at temperatures of 40° C., 60° C., 80° C., 100° C., and 120° C., respectively, while changing the relative humidity and by the method described above, and the results are shown in FIG. 8. As shown in these results, a high proton conductivity of 0.08 S/cm was obtained at a temperature of 120° C. and a relative humidity of 90%. The proton conductivity of C2S-PPSU was almost equivalent to that of Nafion 212. The results of performing the same determination on C4S-PPSU are shown in FIG. 9, which shows that the comparable or better results were obtained as compared with C2S-PPSU as described above.

The invention claimed is:

1. A proton conducting solid polymer electrolyte membrane comprised of a proton conducting polymer electrolyte in the form of a membrane crosslinked via sulfonic groups, wherein the proton conducting solid polymer electrolyte is comprised of a sulfonated polyphenyl compound having a plurality of repeating units, wherein two or more sulfonic groups are introduced on average into one repeating unit, and wherein the sulfonated polyphenyl compound has the following structure:

2. A solid polymer fuel cell comprising the proton conducting solid polymer electrolyte membrane according to claim 1.

3. An electrode catalyst layer for solid polymer fuel cells, the electrode catalyst layer comprising the proton conducting polymer electrolyte according to claims 1 crosslinked via sulfonic groups.

4. A solid polymer fuel cell comprising the electrode catalyst layer according to claim 3.

5. A method for producing a proton conducting solid polymer electrolyte membrane, the method comprising: forming the proton conducting polymer electrolyte according to claims 1 in the form of a membrane; and crosslinking the proton conducting polymer electrolyte via sulfonic groups.

6. The method for producing a proton conducting solid polymer electrolyte membrane according to claim 5, wherein the crosslinking is performed by a single treatment or a combination of a plurality of treatments selected from the group consisting of heat treatment, crosslinking treatment by means of addition of a crosslinking agent, and exposure treatment to radiation or electromagnetic wave.

7. The method for producing a proton conducting solid polymer electrolyte membrane according to claim 6, wherein the crosslinking agent is a polyhydric alcohol.

8. A method for producing an electrode catalyst layer for solid polymer fuel cells, the method comprising: mixing at least an electrode catalyst and the proton conducting electrolyte according to claims 1; and then crosslinking the proton conducting electrolyte via sulfonic groups.

9. The method for producing an electrode catalyst layer according to claim 8, wherein the crosslinking is performed by a single treatment or a combination of a plurality of treatments selected from the group consisting of heat treatment, crosslinking treatment by means of addition of a crosslinking agent, and exposure treatment to radiation or electromagnetic wave.

* * * * *

UNITED STATES PATENT AND TRADEMARK OFFICE
CERTIFICATE OF CORRECTION

PATENT NO. : 10,862,151 B2
APPLICATION NO. : 15/744640
DATED : December 8, 2020
INVENTOR(S) : Jedeok Kim et al.

Page 1 of 1

It is certified that error appears in the above-identified patent and that said Letters Patent is hereby corrected as shown below:

On the Title Page

In (54) Title, in the seventh line, delete "SLID" and replace with --SOLID--.

In the Claims

In Column 19, Claim 3, Line 30, delete "claims" and insert in its place --claim--.

In Column 20, Claim 8, Line 22, delete "claims" and insert in its place --claim--.

Signed and Sealed this
Ninth Day of February, 2021

Drew Hirshfeld
*Performing the Functions and Duties of the*
*Under Secretary of Commerce for Intellectual Property and*
*Director of the United States Patent and Trademark Office*